United States Patent
Kitagawa et al.

(10) Patent No.: US 11,035,053 B2
(45) Date of Patent: Jun. 15, 2021

(54) RUTHENIUM NANOPARTICLES WITH ESSENTIALLY FACE-CENTERED CUBIC STRUCTURE AND METHOD FOR PRODUCING THE SAME

(75) Inventors: Hiroshi Kitagawa, Nara (JP); Kohei Kusada, Okayama (JP)

(73) Assignee: JAPAN SCIENCE AND TECHNOLOGY AGENCY, Saitama (JP)

( * ) Notice: Subject to any disclaimer, the term of this patent is extended or adjusted under 35 U.S.C. 154(b) by 727 days.

(21) Appl. No.: 14/344,840

(22) PCT Filed: Sep. 13, 2012

(86) PCT No.: PCT/JP2012/005838
§ 371 (c)(1),
(2), (4) Date: Mar. 13, 2014

(87) PCT Pub. No.: WO2013/038674
PCT Pub. Date: Mar. 21, 2013

(65) Prior Publication Data
US 2014/0377126 A1 Dec. 25, 2014

(30) Foreign Application Priority Data
Sep. 16, 2011 (JP) .............. JP2011-202735

(51) Int. Cl.
C30B 7/14 (2006.01)
C30B 29/02 (2006.01)
(Continued)

(52) U.S. Cl.
CPC .............. *C30B 7/14* (2013.01); *B01J 23/462* (2013.01); *B01J 35/0013* (2013.01);
(Continued)

(58) Field of Classification Search
CPC .................................. C22C 5/04; C30B 7/14
See application file for complete search history.

(56) References Cited

U.S. PATENT DOCUMENTS 6,875,537 B2    4/2005  Tani et al.
7,347,885 B1    3/2008  Keller et al.
(Continued)

FOREIGN PATENT DOCUMENTS

JP      2003-178764 A    6/2003
JP      2007-213890 A    8/2007
(Continued)

OTHER PUBLICATIONS

Size effect of Ruthenium Nanoparticles in Catalystic Carbon Monoxide Oxidation Sang Hoon Joo Nano Letter 2010 Published on web Jun. 22, 2010, pp. 2709-2713 with Supporting information pp. 1-7.*
(Continued)

*Primary Examiner* — Jenny R Wu
(74) *Attorney, Agent, or Firm* — Micheal Best & Friedrich LLP

(57) ABSTRACT

Disclosed are ruthenium nanoparticles having an essentially face-centered cubic structure. Disclosed is a method for producing ruthenium nanoparticles having an essentially face-centered cubic structure. This production method includes a step (i) of maintaining a solution containing ruthenium (III) acetylacetonate, polyvinylpyrrolidone, and triethylene glycol at a temperature of 180° C. or higher.

20 Claims, 16 Drawing Sheets

(51) Int. Cl.
*H01M 4/92* (2006.01)
*B22F 1/00* (2006.01)
*B01J 35/00* (2006.01)
*B01J 23/46* (2006.01)
*B22F 9/24* (2006.01)
*C22C 5/04* (2006.01)
*B82Y 30/00* (2011.01)
*B01J 37/08* (2006.01)
*B01J 35/10* (2006.01)
*B01J 37/00* (2006.01)

(52) U.S. Cl.
CPC .......... *B01J 37/086* (2013.01); *B22F 1/0018* (2013.01); *B22F 1/0044* (2013.01); *B22F 9/24* (2013.01); *B82Y 30/00* (2013.01); *C22C 5/04* (2013.01); *C30B 29/02* (2013.01); *H01M 4/92* (2013.01); *B01J 35/002* (2013.01); *B01J 35/1023* (2013.01); *B01J 37/0045* (2013.01); *B01J 37/0072* (2013.01); *B01J 37/08* (2013.01)

(56) References Cited

U.S. PATENT DOCUMENTS

| | | | |
|---|---|---|---|
| 8,361,924 B2 | 1/2013 | Tanaka et al. | |
| 9,273,378 B2* | 3/2016 | Kitagawa | B22F 1/0018 |
| 2004/0219419 A1* | 11/2004 | Tani | H01M 4/8885 |
| | | | 429/483 |
| 2007/0034052 A1* | 2/2007 | Vanheusden | B22F 1/0018 |
| | | | 75/362 |
| 2009/0274941 A1 | 11/2009 | Yamada et al. | |
| 2012/0094140 A1 | 4/2012 | Kitagawa et al. | |
| 2012/0328936 A1* | 12/2012 | Wessells | H01M 10/054 |
| | | | 429/188 |
| 2016/0311028 A1* | 10/2016 | Harutyunyan | B22F 9/24 |

FOREIGN PATENT DOCUMENTS

| | | | |
|---|---|---|---|
| JP | 2007-308754 A | 11/2007 | |
| JP | 2012-041581 A | 3/2012 | |
| KR | 10-2010-0025988 A | 3/2010 | |
| WO | WO-2010/122811 A1 | 10/2010 | |
| WO | WO-2010122811 A1 * | 10/2010 | ............ B22F 1/0018 |

OTHER PUBLICATIONS

Office Action issued in Korean Application No. 10-2014-7009262, dated Jun. 18, 2015.
S.H. Joo, J.Y. Park, J. R. Renzas, D. R. Butcher, W. Huang, and G. A. Somorjai, "Size Effect of Ruthenium Nanoparticles in Catalytic Carbon Monoxide Oxidation", Nano Letters 2010 vol. 10, pp. 2709-2713 (5 sheets), American Chemical Society.
International Search Report issued in Application No. PCT/JP2012/005838, dated Oct. 16, 2012.
Written Opinion of International Preliminary Searching Authority of PCT/JP2012/005838, dated Oct. 8, 2013.
S.H. Joo, J.Y. Park, J. R. Renzas, D. R. Butcher, W. Huang, and G. A. Somorjai, "Size Effect of Ruthenium Nanoparticles in Catalytic Carbon Monoxide Oxidation", Nano Letter 2010 vol. 10, pp. 2709-2713 (5 sheets), American Chemical Society.
Written Opinion of International Search Authority of PCT/JP2012/005838, dated Oct. 8, 2013.
Extended Search Report issued in European Application No. 12832108.0, dated Apr. 30, 2015.
Fan et al., "Crystal phase-controlled synthesis, properties and applications of noble metal nanomaterials", Chem. Soc. Rev., 2016, 45, 63 The Royal Society of Chemistry, DOI: 10.1039/c5cs00467e, pp. 63-82, received Jun. 12, 2015.
CRC Handbook of Chemistry and Physics, 91$^{st}$ ed.; Haynes, W.M., Ed.; CRC Press: Boca Raton, FL, 2010, pp. 3-232 and 3-498.
Am Varambhia et al., "Quantification of a Heterogeneous Ruthenium Catalyst on Carbon-black using ADF Imaging," Electron Microscopy and Analysis Group Conference, Journal of Physics: Conference Series, 644 012035, doi: 10.1088/1742-6596/644/1/012035, IOP Publishing, 2015, pp. 1-4.
Alyami et al., "Synthesis and characterization of branched fcc/hcp ruthenium nanostructures and their catalytic activity in ammonia borane hydrolysis," Crystal Growth & Design, doi: 10.1021/acs.cdg.7b01489, ACS Publications, Jan. 29, 2018, pp. 1-30.

* cited by examiner

RUTHENIUM NANOPARTICLES WITH ESSENTIALLY FACE-CENTERED CUBIC STRUCTURE AND METHOD FOR PRODUCING THE SAME

TECHNICAL FIELD

The present invention relates to ruthenium nanoparticles with essentially face-centered cubic structure and a method for producing the ruthenium nanoparticles.

BACKGROUND ART

Methods for producing metal nanoparticles by reducing a metal compound in a solution have been proposed. Methods for producing ruthenium nanoparticles have also been proposed (Non-Patent Literature 1).

In Non-Patent Literature 1, ruthenium nanoparticles with a particle diameter of 2.1 to 6.0 nm are produced. In Non-Patent Literature 1, ethylene glycol or 1,4-butanediol is used as both a solvent and a reducing agent. Nanoparticles with a particle diameter of 2.1 to 3.1 nm are prepared by one-step reduction using ethylene glycol or 1,4-butanediol. On the other hand, nanoparticles with a particle diameter of 3.8 to 6.0 nm are prepared by a two-step process using 3.1-nm ruthenium nanoparticles as seeds. The nanoparticles with a particle diameter of 3.8 to 6.0 nm are prepared using 1,4-butanediol. Non-Patent Literature 1 describes that small ruthenium nanoparticles have a hcp (hexagonal close-packed) structure whereas bigger nanoparticles show a mixed phase of fcc (face-centered cubic) and hcp structures.

CITATION LIST

Non-Patent Literature

Non-Patent Literature 1 NANO Letters, vol. 10, pp. 2709-2713, 2010

SUMMARY OF INVENTION

Technical Problem

There has been no report of ruthenium nanoparticles having a crystal structure consisting essentially of a face-centered cubic structure. It is an object of the present invention to provide ruthenium nanoparticles having a crystal structure consisting essentially of a face-centered cubic structure and a method for producing these ruthenium nanoparticles.

Solution to Problem

In order to achieve the above object, the ruthenium nanoparticles of the present invention are ruthenium nanoparticles having an essentially face-centered cubic structure. These ruthenium nanoparticles can be used as a carbon monoxide oxidation catalyst.

The production method of the present invention is a method for producing ruthenium nanoparticles having an essentially face-centered cubic structure, and includes a step (i) of maintaining a solution containing ruthenium (III) acetylacetonate, polyvinylpyrrolidone, and triethylene glycol at a temperature of 180° C. or higher.

Advantageous Effects of Invention

According to the present invention, it is possible to obtain ruthenium nanoparticles having a crystal structure consisting essentially of a face-centered cubic structure. In particular, according to a preferred embodiment of the present invention, it is possible to obtain ruthenium nanoparticles having a crystal structure consisting essentially of a face-centered cubic structure by one-step reduction.

DESCRIPTION OF EMBODIMENTS

Figure 1:
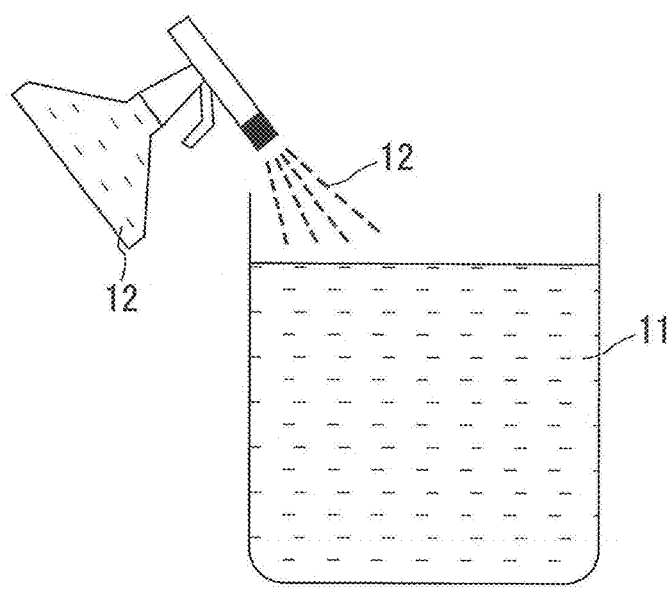
FIG. 1 schematically shows a step of producing ruthenium nanoparticles in Example 1.

Hereinafter, embodiments of the present invention are described by way of examples. The present invention is not limited to the following embodiments and examples.

[Production Method of Ruthenium Nanoparticles]

The production method of the present invention is a method for producing ruthenium nanoparticles having an essentially face-centered cubic structure. As used herein, the phrase "having an essentially face-centered cubic structure"

means that an X-ray diffraction pattern obtained by X-ray diffraction measurement can only be fitted with a face-centered cubic lattice having a space group Fm-3m. In another aspect, the ruthenium nanoparticles of the present invention are the nanoparticles in which no structure other than the face-centered cubic structure can essentially be observed by X-ray diffraction measurement. A preferred embodiment of the ruthenium nanoparticles of the present invention has a crystal structure consisting of a face-centered cubic structure. Hereinafter, the face-centered cubic structure may be referred to as a "fcc structure", and the hexagonal close-packed structure may be referred to as a "hcp structure".

The production method of the present invention includes a step (step (i)) of maintaining a solution containing ruthenium (III) acetylacetonate ($Ru(CH_3COCHCOCH_3)_3$), polyvinylpyrrolidone, and triethylene glycol at a temperature of 180° C. or higher. In the step (i), ruthenium in a ruthenium compound is reduced and ruthenium nanoparticles are produced. Hereinafter, the solution containing ruthenium (III) acetylacetonate, polyvinylpyrrolidone, and triethylene glycol may be referred to as an "organic solution (S)". Ruthenium (III) acetylacetonate may be abbreviated as "$Ru(acac)_3$".

In the step (i), the organic solution (S) is maintained at a temperature of 180° C. or higher. Examples of "the temperature of 180° C. or higher" include a temperature ranging from 180° C. to 220° C., a temperature ranging from 190° C. to 220° C., and a temperature ranging from 200° C. to 220° C. For example, in the step (i), the organic solution (S) may be maintained at a temperature ranging from 180° C. to 220° C.

In the step (i), the length of time for which the organic solution (S) is maintained at a temperature of 180° C. or higher may be in a range of 1 minute to 6 hours depending on the temperature. The length of time may be, for example, in a range of 5 minutes to 3 hours.

The use of polyvinylpyrrolidone (hereinafter may be referred to as "PVP") prevents aggregation of the ruthenium nanoparticles.

In the step (i), the temperature of the organic solution (S), the length of time for which the temperature is maintained, the concentrations of PVP and $Ru(acac)_3$ contained in the organic solution (S) may be selected from the ranges shown in Examples 1 to 7 described later.

The first and second examples of the step (i) are described below.

The first example of the step (i) includes a step (a) and a step (b). In the step (a), a first organic solution containing polyvinylpyrrolidone and triethylene glycol and a second organic solution containing ruthenium (III) acetylacetonate are prepared. In the step (b), the second organic solution is sprayed into the first organic solution heated to a temperature of 180° C. or higher (for example, a temperature ranging from 200° C. to 220° C.). Since the amount of the sprayed second organic solution is usually smaller than the amount of the first organic solution, there is no need to consider the temperature of the second organic solution. However, the second organic solution may be heated, if necessary, before it is sprayed into the first organic solution.

In the step (b), the first organic solution and the second organic solution are mixed together to prepare the organic solution (S). As described above, the organic solution (S) is maintained at a temperature of 180° C. or higher (for example, a temperature ranging from 200° C. to 220° C.) for a predetermined length of time.

The step (i) may include a step of dropping the second solution into the heated first solution. For example, the step (i) may include a step of dropping the second organic solution into the first organic solution heated to a temperature of 180° C. or higher.

The second example of the step (i) includes a step of preparing a solution (organic solution (S)) containing ruthenium (III) acetylacetonate, polyvinylpyrrolidone, and triethylene glycol and a step of heating the organic solution (S) to a temperature of 180° C. or higher and maintaining the organic solution (S) at that temperature for a predetermined length of time.

[Ruthenium Nanoparticles]

The ruthenium nanoparticles of the present invention have an essentially fcc structure. The ruthenium nanoparticles of the present invention can be produced by the production method of the present invention.

The average particle diameter of the ruthenium nanoparticles of the present invention may be 7 nm or less, 6 nm or less, or 5 nm or less. The average particle diameter may be, for example, in a range of 2 nm to 7 nm, 2 nm to 6 nm, or 2.6 nm to 5.1 nm. As used herein, the average particle diameter is an average value of the diameters of at least 100 nanoparticles selected from the transmission electron microscope images of nanoparticles.

The ruthenium nanoparticles of the present invention having a fcc structure can be used in various applications. For example, they can be used as a catalyst for organic synthesis, a catalyst for fuel cell electrodes, a data storage material, etc. The ruthenium nanoparticles having a fcc structure exhibit high activity in carbon monoxide (CO) oxidation. Since carbon monoxide causes poisoning of fuel cell electrode catalysts, carbon monoxide oxidation catalysts are particularly important in the field of fuel cells.

EXAMPLES

Hereinafter, the present invention will be described in more detail by way of Examples. $Ru(acac)_3$ used in the following Examples was obtained from Wako Pure Chemical Industries, Ltd.

Example 1

In Example 1, an example of the production of ruthenium nanoparticles by the production method of the present invention is described. First, a first organic solution was prepared by dissolving 1.0 mmol of PVP in 100 ml of triethylene glycol. A second organic solution was prepared by dissolving $Ru(acac)_3$ in 40 ml of ethanol. The concentration of $Ru(acac)_3$ in the second organic solution was 2.5 mM (mmol/l).

Next, the first organic solution was heated to 220° C. Then, as shown in FIG. 1, the second organic solution 12 was sprayed with an atomizer into the heated first organic solution 11. The mixture thus obtained was maintained at 220° C. for 5 minutes. As a result, a colloidal solution of ruthenium nanoparticles with an average particle diameter of 4.6±1.1 nm was obtained. As used herein, "4.6 nm" is the average particle diameter, and "±1.1 nm" is the standard deviation (the same applies to the following average particle diameters). It should be noted that the average particle diameter was measured by the method described above (the same applies hereinafter).

The ruthenium nanoparticles thus obtained were subjected to X-ray diffraction measurement and electron microscopic observation. The X-ray diffraction measurement was performed using a Bruker AXS, D8 ADVANCE diffractometer with λ=CuKα at room temperature.

Figure 2A:
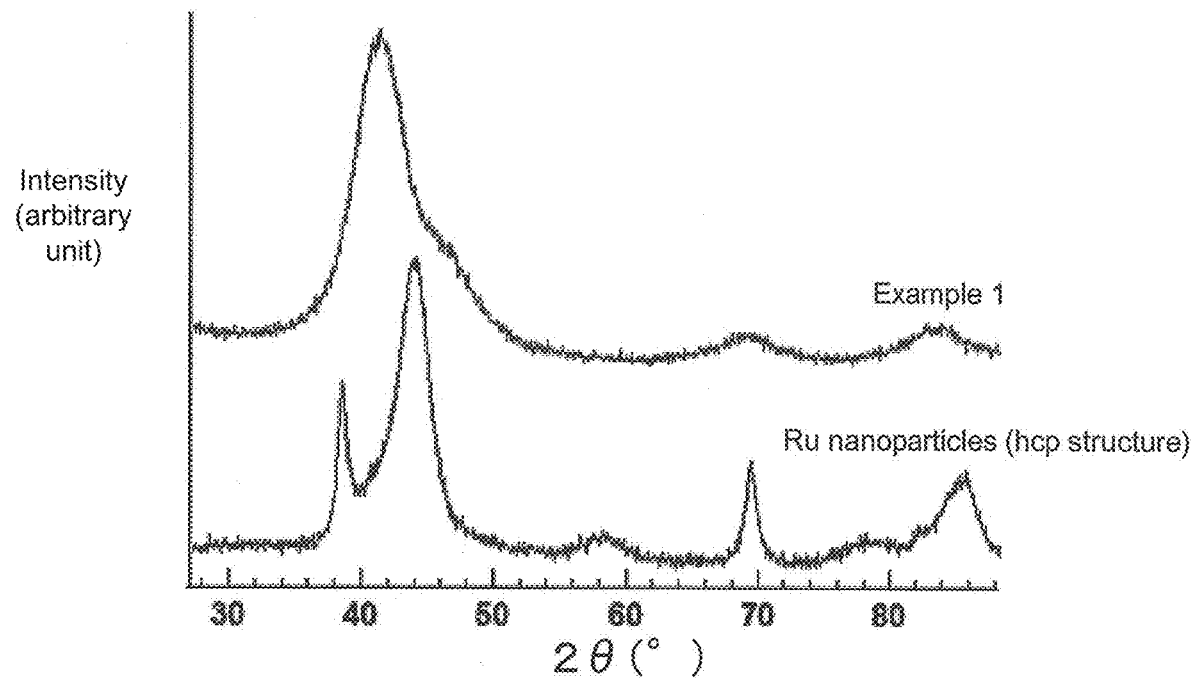
FIG. 2A shows an X-ray diffraction pattern of the ruthenium nanoparticles of Example 1.
Figure 2B:
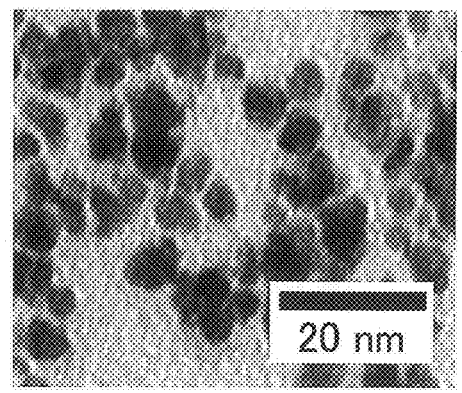
FIG. 2B shows an electron microscope image of the ruthenium nanoparticles of Example 1.
Figure 3:
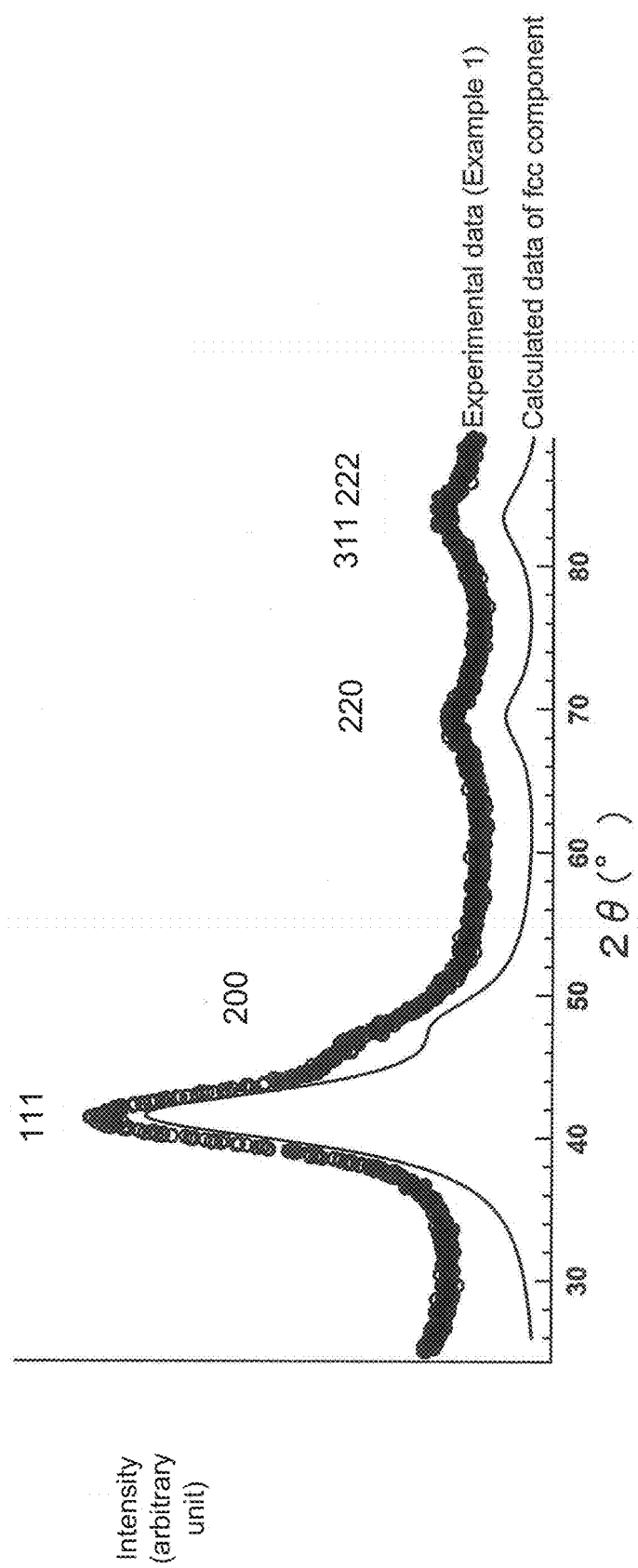
FIG. 3 shows the X-ray diffraction pattern of the ruthenium nanoparticles of Example 1 and a calculated X-ray diffraction pattern of the fcc component.

FIG. 2A shows the X-ray diffraction pattern measured, and FIG. 2B shows the electron microscope image. FIG. 2A also shows the X-ray diffraction pattern of ruthenium nanoparticles having a hcp structure, for reference. FIG. 3 shows the X-ray diffraction pattern of the ruthenium nanoparticles of Example 1 and the calculated X-ray diffraction pattern of the fcc component. This calculated X-ray diffraction pattern was obtained by the Le Bail method (the calculated patterns below were also obtained by the same method). FIG. 2A and FIG. 3 reveal that the ruthenium nanoparticles of Example 1 do not have a hcp structure but have a fcc structure. The X-ray diffraction pattern of the ruthenium nanoparticles of Example 1 cannot be fitted with a space group $P6_3/mmc$ for a hcp structure but can only be fitted with a space group Fm-3m for a fcc structure.

Example 2

In Example 2, another example of the production of ruthenium nanoparticles by the production method of the present invention is described. First, a first organic solution was prepared by dissolving 0.25 mmol of PVP in 100 ml of triethylene glycol. A second organic solution was prepared by dissolving $Ru(acac)_3$ in 10 ml of ethanol. The concentration of $Ru(acac)_3$ in the second organic solution was 2.5 mM (mmol/l).

Next, the first organic solution was heated to 200° C. Then, as shown in FIG. 1, the second organic solution 12 was sprayed with an atomizer into the heated first organic solution 11. The mixture thus obtained was maintained at 200° C. for 10 minutes. As a result, a colloidal solution of ruthenium nanoparticles with an average particle diameter of 4.4±0.9 nm was obtained. The ruthenium nanoparticles thus obtained were subjected to the same measurement as in Example 1.

Figure 4A:
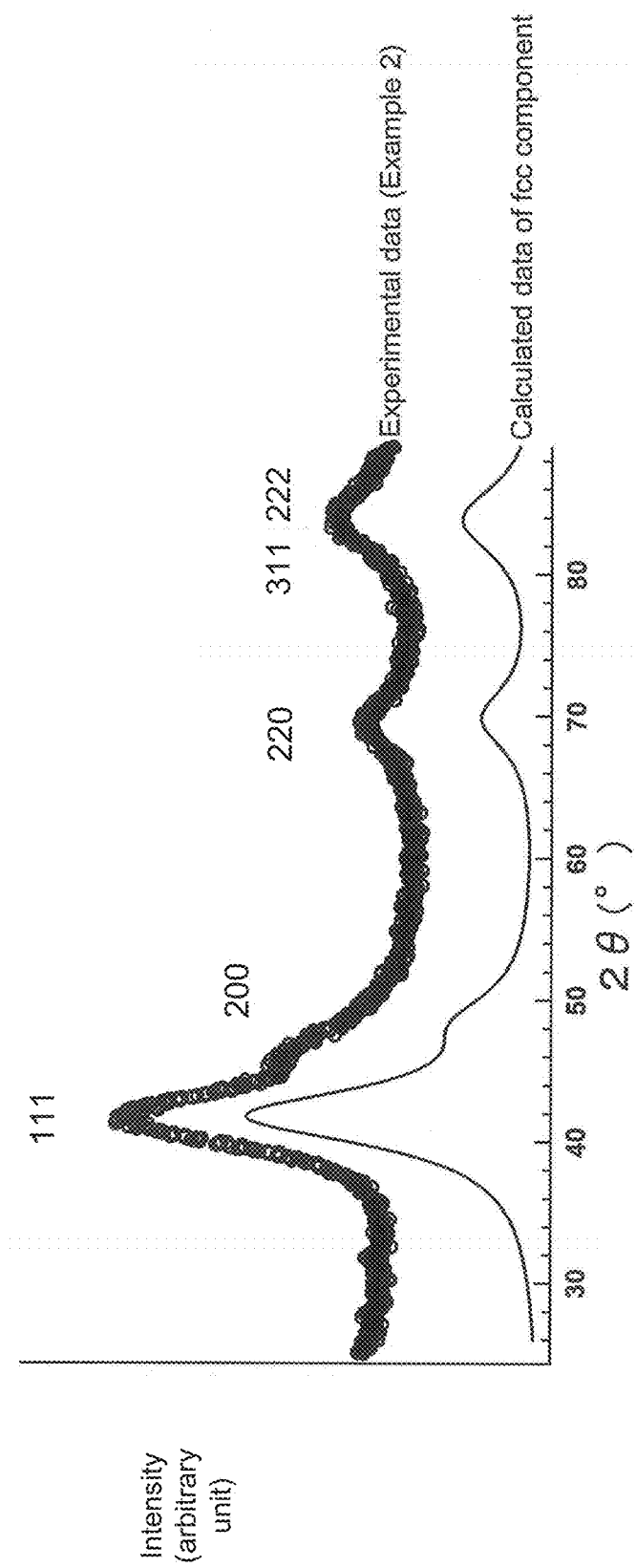
FIG. 4A shows an X-ray diffraction pattern of ruthenium nanoparticles of Example 2 and a calculated X-ray diffraction pattern of the fcc component.
Figure 4B:
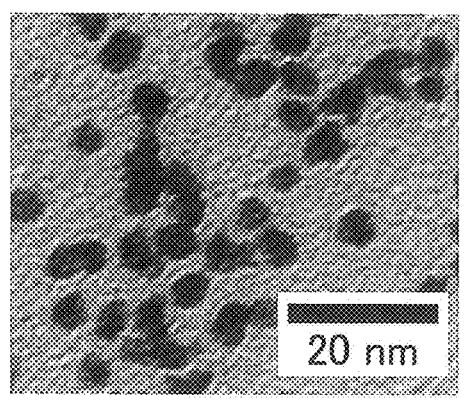
FIG. 4B shows an electron microscope image of the ruthenium nanoparticles of Example 2.

FIG. 4A shows the X-ray diffraction pattern measured, and FIG. 4B shows the electron microscope image. FIG. 4A also shows the calculated X-ray diffraction pattern of the fcc component. FIG. 4A reveals that the ruthenium nanoparticles of Example 2 do not have a hcp structure but have a fcc structure.

Example 3

In Example 3, another example of the production of ruthenium nanoparticles by the production method of the present invention is described. First, an organic solution was prepared by mixing 20 ml of triethylene glycol, 0.05 mmol of PVP, 2 ml of ethanol, and $Ru(acac)_3$. The concentration of $Ru(acac)_3$ in the organic solution was 2.3 mM (mmol/l).

Next, the organic solution was heated to 190° C. and maintained at 190° C. for 3 hours. As a result, a colloidal solution of ruthenium nanoparticles with an average particle diameter of 3.0±0.6 nm was obtained. The ruthenium nanoparticles thus obtained were subjected to the same measurement as in Example 1.

Figure 5A:
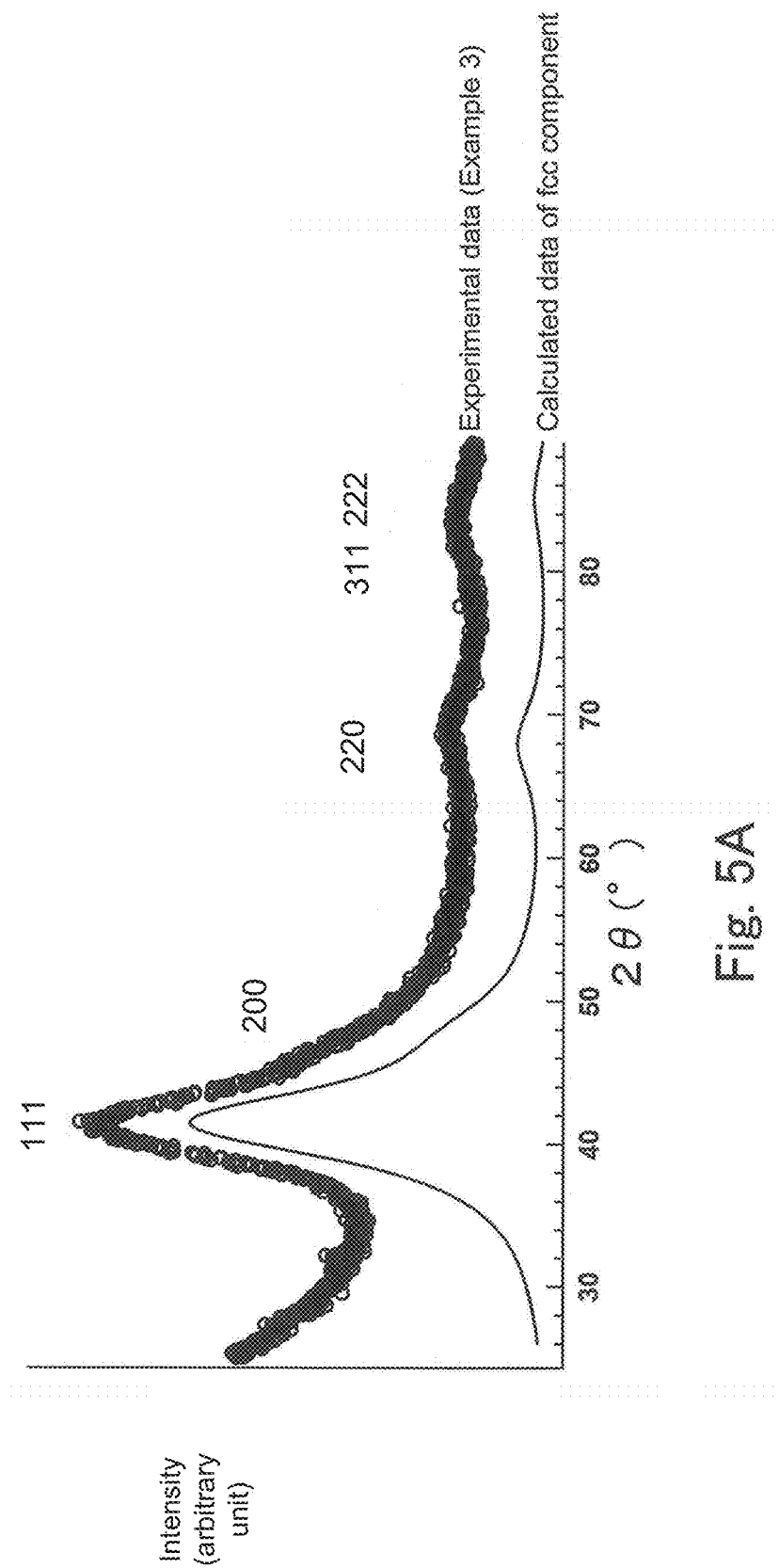
FIG. 5A shows an X-ray diffraction pattern of ruthenium nanoparticles of Example 3 and a calculated X-ray diffraction pattern of the fcc component.
Figure 5B:
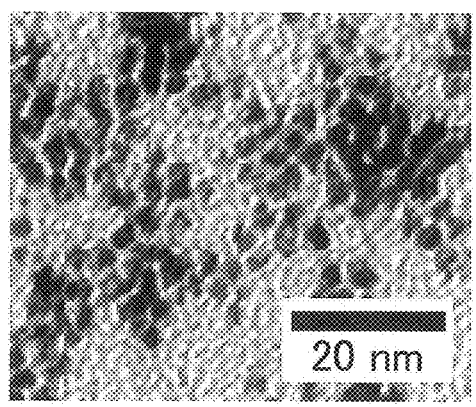
FIG. 5B shows an electron microscope image of the ruthenium nanoparticles of Example 3.

FIG. 5A shows the X-ray diffraction pattern measured, and FIG. 5B shows the electron microscope image. FIG. 5A also shows the calculated X-ray diffraction pattern of the fcc component. FIG. 5A reveals that the ruthenium nanoparticles of Example 3 do not have a hcp structure but have a fcc structure.

Example 4

In Example 4, another example of the production of ruthenium nanoparticles by the production method of the present invention is described. First, an organic solution was prepared by mixing 200 ml of triethylene glycol, 10.0 mmol of PVP, and an ethanol solution of $Ru(acac)_3$. The ethanol solution of $Ru(acac)_3$ was prepared by dissolving 2.0 mmol of $Ru(acac)_3$ in 5 ml of ethanol.

Next, the organic solution was refluxed at 220° C. for 3 hours. That is, the organic solution was maintained at 220° C. for 3 hours. As a result, a colloidal solution of ruthenium nanoparticles with an average particle diameter of 2.6±0.8 nm was obtained. The ruthenium nanoparticles thus obtained were subjected to the same measurement as in Example 1.

Figure 6A:
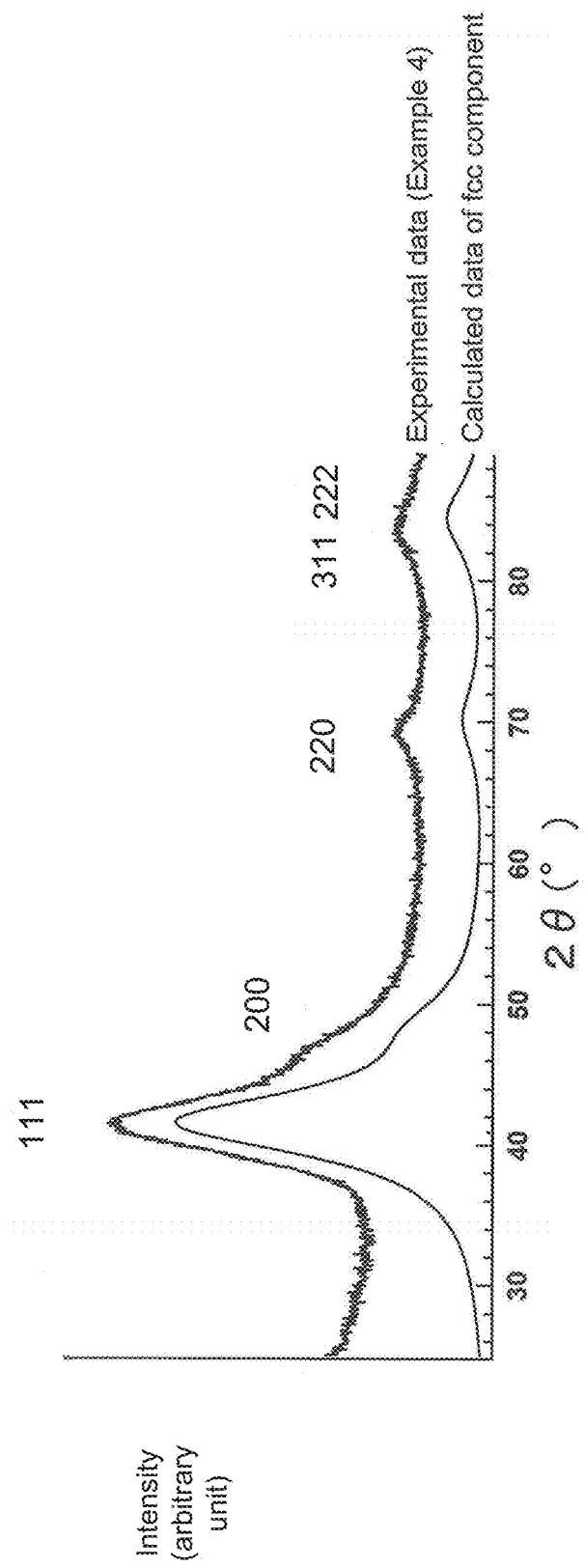
FIG. 6A shows an X-ray diffraction pattern of ruthenium nanoparticles of Example 4 and a calculated X-ray diffraction pattern of the fcc component.
Figure 6B:
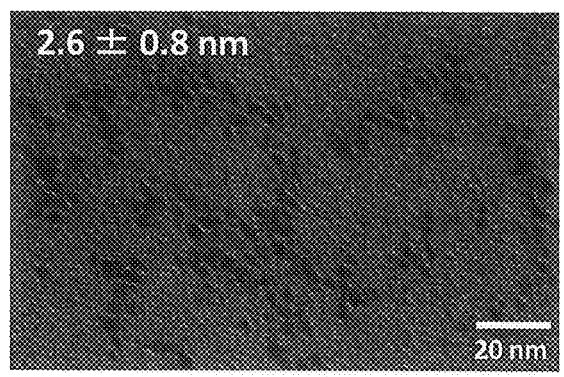
FIG. 6B shows an electron microscope image of the ruthenium nanoparticles of Example 4.

FIG. 6A shows the X-ray diffraction pattern measured, and FIG. 6B shows the electron microscope image. FIG. 6A also shows the calculated X-ray diffraction pattern of the fcc component. FIG. 6A reveals that the ruthenium nanoparticles of Example 4 do not have a hcp structure but have a fcc structure.

Example 5

In Example 5, another example of the production of ruthenium nanoparticles by the production method of the present invention is described. First, an organic solution was prepared by mixing 50 ml of triethylene glycol, 1.0 mmol of PVP, and an ethanol solution of $Ru(acac)_3$. The ethanol solution of $Ru(acac)_3$ was prepared by dissolving 2.0 mmol of $Ru(acac)_3$ in 5 ml of ethanol.

Next, the organic solution was refluxed at 220° C. for 3 hours. That is, the organic solution was maintained at 220° C. for 3 hours. As a result, a colloidal solution of ruthenium nanoparticles with an average particle diameter of 3.9±0.8 nm was obtained. The ruthenium nanoparticles thus obtained were subjected to the same measurement as in Example 1.

Figure 7A:
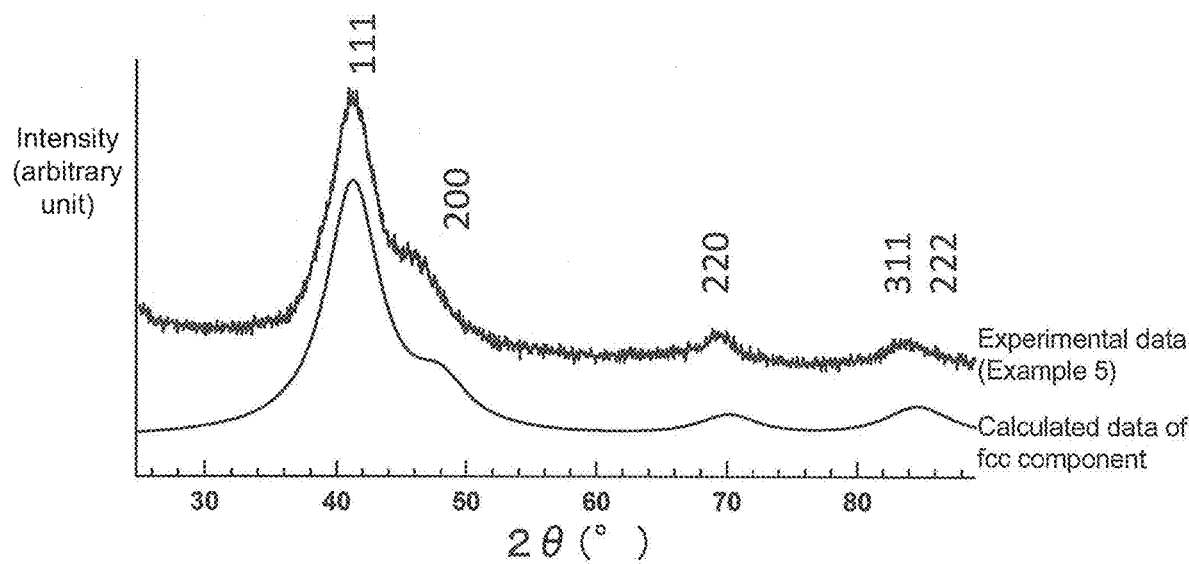
FIG. 7A shows an X-ray diffraction pattern of ruthenium nanoparticles of Example 5 and a calculated X-ray diffraction pattern of the fcc component.
Figure 7B:
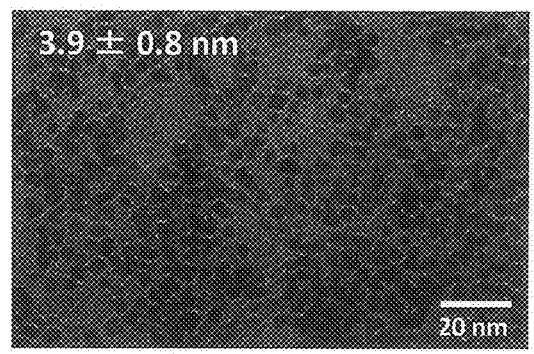
FIG. 7B shows an electron microscope image of the ruthenium nanoparticles of Example 5.

FIG. 7A shows the X-ray diffraction pattern measured, and FIG. 7B shows the electron microscope image. FIG. 7A also shows the calculated X-ray diffraction pattern of the fcc component. FIG. 7A reveals that the ruthenium nanoparticles of Example 5 do not have a hcp structure but have a fcc structure.

Example 6

In Example 6, another example of the production of ruthenium nanoparticles by the production method of the present invention is described. First, a first organic solution was prepared by dissolving 3.0 mmol of PVP in 100 ml of triethylene glycol. A second organic solution was prepared by dissolving 3.0 mmol of $Ru(acac)_3$ in 80 ml of ethanol. Next, the second organic solution was added to the first organic solution heated to 220° C., and the mixture obtained was maintained at 220° C. for 15 minutes. As a result, a colloidal solution of ruthenium nanoparticles with an average particle diameter of 5.1±1.4 nm was obtained. The ruthenium nanoparticles thus obtained were subjected to the same measurement as in Example 1.

Figure 8A:
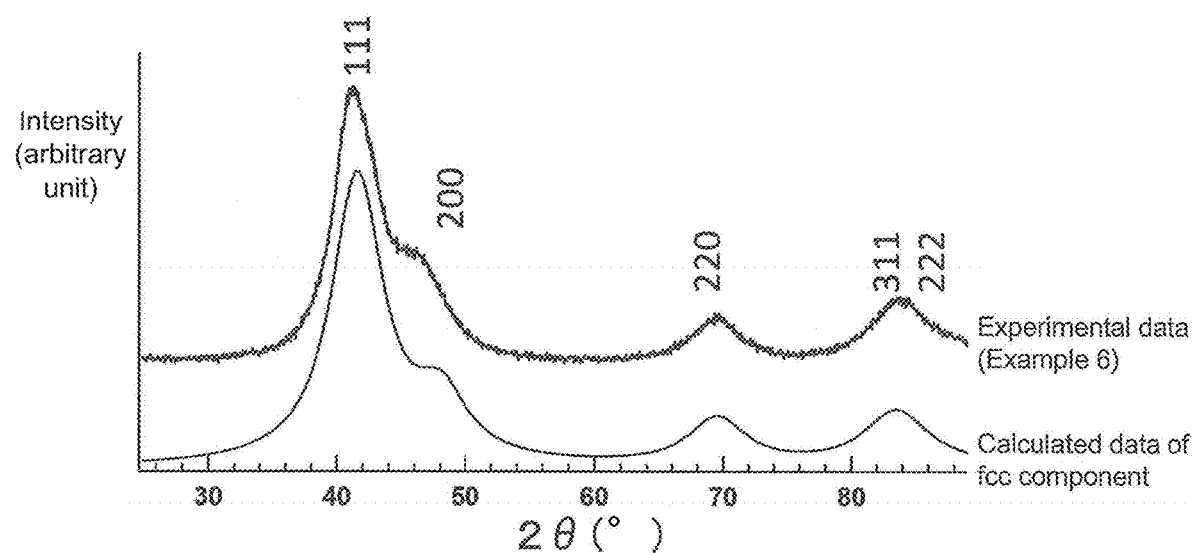
FIG. 8A shows an X-ray diffraction pattern of ruthenium nanoparticles of Example 6 and a calculated X-ray diffraction pattern of the fcc component.
Figure 8B:
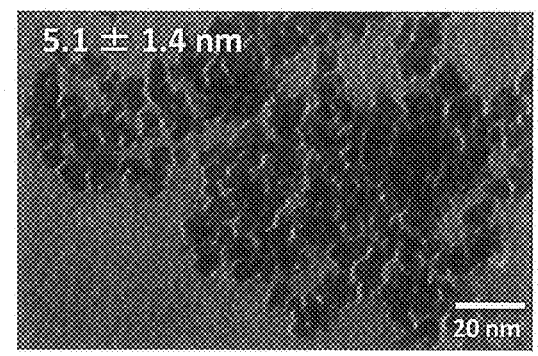
FIG. 8B shows an electron microscope image of the ruthenium nanoparticles of Example 6.

FIG. 8A shows the X-ray diffraction pattern measured, and FIG. 8B shows the electron microscope image. FIG. 8A also shows the calculated X-ray diffraction pattern of the fcc component. FIG. 8A reveals that the ruthenium nanoparticles of Example 6 do not have a hcp structure but have a fcc structure.

Comparative Example 1

In Comparative Example 1, another example of the production of ruthenium nanoparticles is described. First, an organic solution was prepared by dissolving 10.0 mmol of PVP in 100 ml of triethylene glycol. An aqueous solution was prepared by dissolving ruthenium (III) chloride hydrate ($RuCl_3.nH_2O$) in 40 ml of water. The concentration of ruthenium (III) chloride hydrate in the aqueous solution was 2.5 mM (mmol/l).

Next, the organic solution was heated to 220° C. Then, the aqueous solution was sprayed with an atomizer into the organic solution in the same manner as shown in FIG. 1. The mixture thus obtained was maintained at 220° C. for 5 minutes. As a result, a colloidal solution of ruthenium nanoparticles with an average particle diameter of 5.6±1.6 nm was obtained. The ruthenium nanoparticles thus obtained were subjected to the same measurement as in Example 1.

Figure 9A:
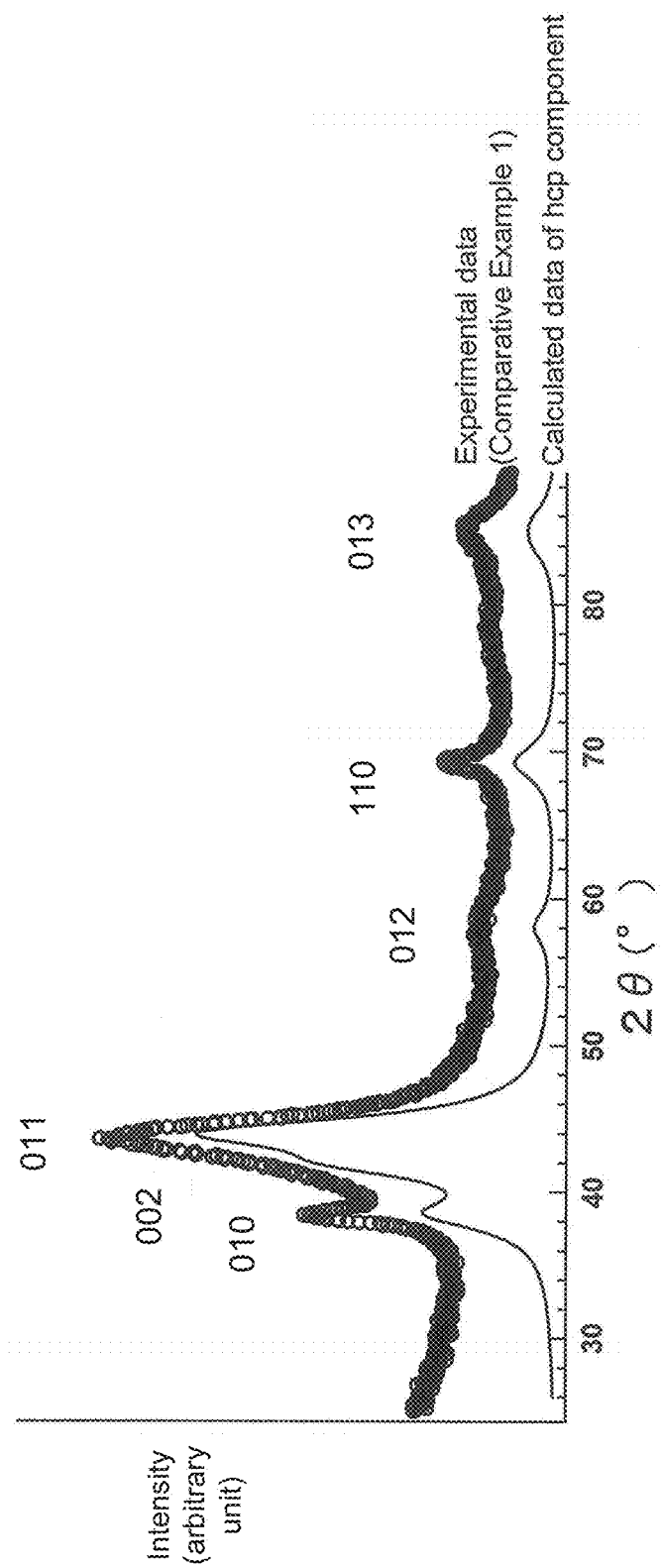
FIG. 9A shows an X-ray diffraction pattern of ruthenium nanoparticles of Comparative Example 1.
Figure 9B:
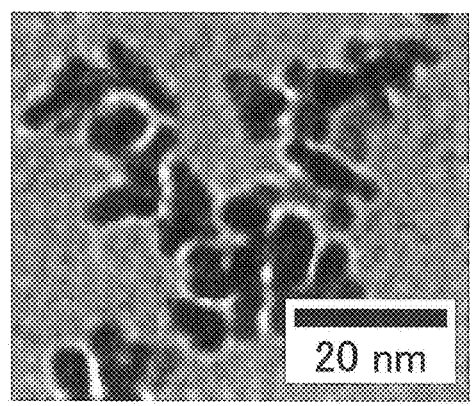
FIG. 9B shows an electron microscope image of the ruthenium nanoparticles of Comparative Example 1.

FIG. 9A shows the X-ray diffraction pattern measured, and FIG. 9B shows the electron microscope image. FIG. 9A also shows the X-ray diffraction pattern of the hcp component calculated by the Le Bail method. FIG. 9A reveals that the ruthenium nanoparticles of Comparative Example 1 have a hcp structure.

Example 7

In Example 7, another example of the production of ruthenium nanoparticles by the production method of the present invention is described. First, an organic solution was prepared by mixing 20 ml of triethylene glycol, 1.0 mmol of PVP, and 0.1 mmol of $Ru(acac)_3$. This organic solution was heated at 80° C. for 20 minutes under vacuum. Next, this organic solution was heated at 180° C. for 2 hours under an argon atmosphere. Thus, a colloidal solution of ruthenium nanoparticles was obtained.

Figure 10:
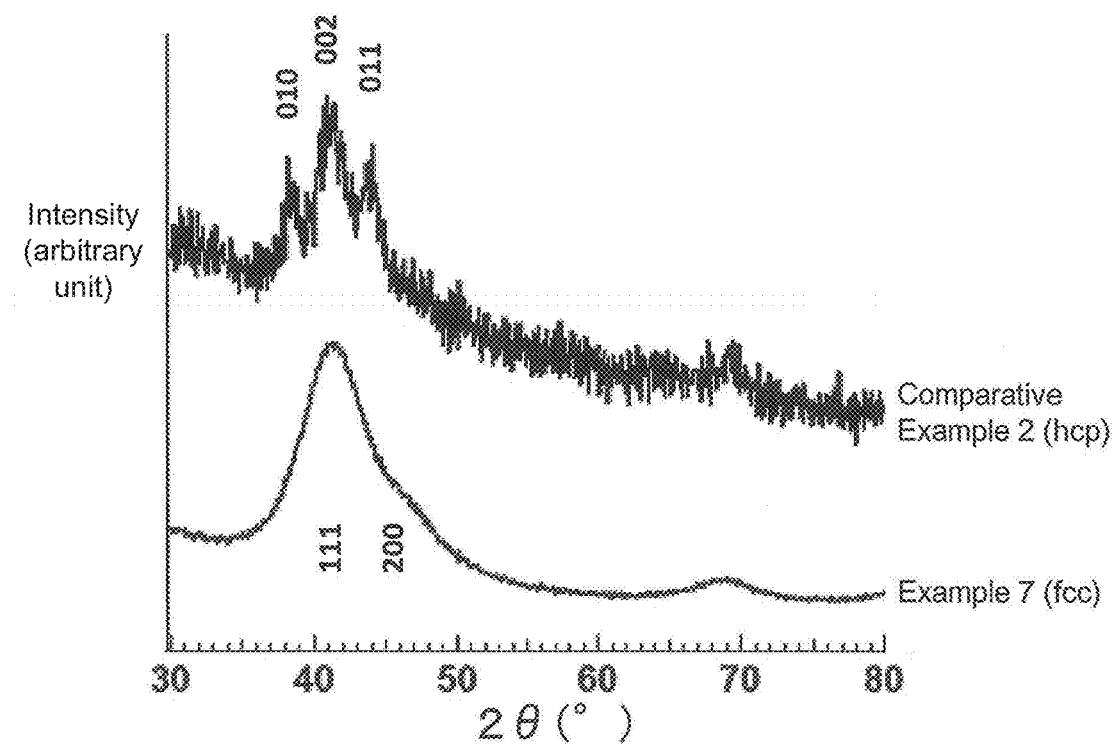
FIG. 10 shows X-ray diffraction patterns of ruthenium nanoparticles of Example 7 and those of Comparative Example 2.

The ruthenium nanoparticles thus obtained were subjected to the X-ray diffraction pattern measurement in the same manner as in Example 1. FIG. 10 shows the X-ray diffraction pattern measured. This X-ray diffraction pattern reveals that the ruthenium nanoparticles of Example 7 do not have a hcp structure but have a fcc structure.

Comparative Example 2

In Comparative Example 2, another example of the production of ruthenium nanoparticles is described. First, a first organic solution was prepared by dissolving 5.0 mmol of PVP in 25 ml of ethylene glycol. A second organic solution was prepared by dissolving 1.0 mmol of $Ru(acac)_3$ in 40 ml of ethylene glycol.

Next, the first organic solution was heated to 190° C. Then, the second organic solution was dropped into the heated first organic solution. The mixture obtained was maintained at 190° C. for 10 minutes. Thus, a colloidal solution of ruthenium nanoparticles was obtained.

The ruthenium nanoparticles thus obtained were subjected to the X-ray diffraction pattern measurement in the same manner as in Example 1. FIG. 10 shows the X-ray diffraction pattern measured. This X-ray diffraction pattern reveals that the ruthenium nanoparticles of Comparative Example 2 have a hcp structure.

As described above, ruthenium nanoparticles having a crystal structure consisting essentially of a fcc structure were obtained by the production method of the present invention. According to the production method of the present invention, it is possible to obtain ruthenium nanoparticles having a crystal structure consisting essentially of a fcc structure by one-step reduction. According to this production method, it is possible to obtain ruthenium nanoparticles, all of which have an essentially fcc structure.

(Evaluation of Catalytic Activity in CO Oxidation Reaction)

The fcc ruthenium nanoparticles (with an average particle diameter of 2.6±0.8 nm) produced in Example 4 were supported on fine γ-alumina particles (as a catalyst support) to produce fine catalyst particles loaded with 1 wt. % of ruthenium. A portion of a water dispersion (1) in which the fine catalyst particles were dispersed was pipetted and added to purified water, followed by ultrasonic treatment. Thus, a water dispersion (2) of the fine catalyst particles was obtained.

Next, a γ-alumina powder (Japan Reference Catalyst (JRC)-AL-08 supplied from Catalysis Society of Japan) was pre-sintered at 800° C. for 5 hours and added to the water dispersion (2). The resulting water dispersion was stirred with a magnetic stirrer for 12 hours. After stirring, the dispersion was transferred into a rotary evaporator and heated to 60° C. under reduced pressure to dry the dispersion into a powder. Then, the powder thus obtained was allowed to stand for 8 hours in a dryer at 120° C. to remove water from the powder. Next, the dried powder (catalyst) was finely ground in a mortar and then formed into a disk shape using a uniaxial molding machine under the conditions of 1.2 MPa and 5 minutes. The powder compact thus obtained was ground and sieved. Thus, fine catalyst particles with a diameter of 180 to 250 μm was obtained.

The CO oxidation activity was measured using a fixed bed reactor. First, 150 mg of catalyst pellets were loaded into a quartz reactor tube (with an inner diameter of 7 mm) to form a catalyst layer. After starting to supply a $He/CO/O_2$ mixed gas (flow rate: $He/CO/O_2$=49/0.5/0.5 ml·$min^{-1}$) to the reactor tube at room temperature, the catalyst layer was heated to 150° C. A gas discharged from the outlet of the reactor tube was sampled 30 minutes after the temperature of the catalyst layer reached 150° C., and the discharged gas was analyzed with a gas chromatograph equipped with a thermal conductivity detector. After the analysis was completed, the temperature of the catalyst layer was raised by 5° C., and a discharged gas was analyzed again 30 minutes after the temperature was raised. While repeating this process, the temperature of the catalyst layer was raised until the CO conversion rate (oxidation rate) reached 100%. The relationship between the CO oxidation activity and the temperature was measured in this manner.

Figure 11:
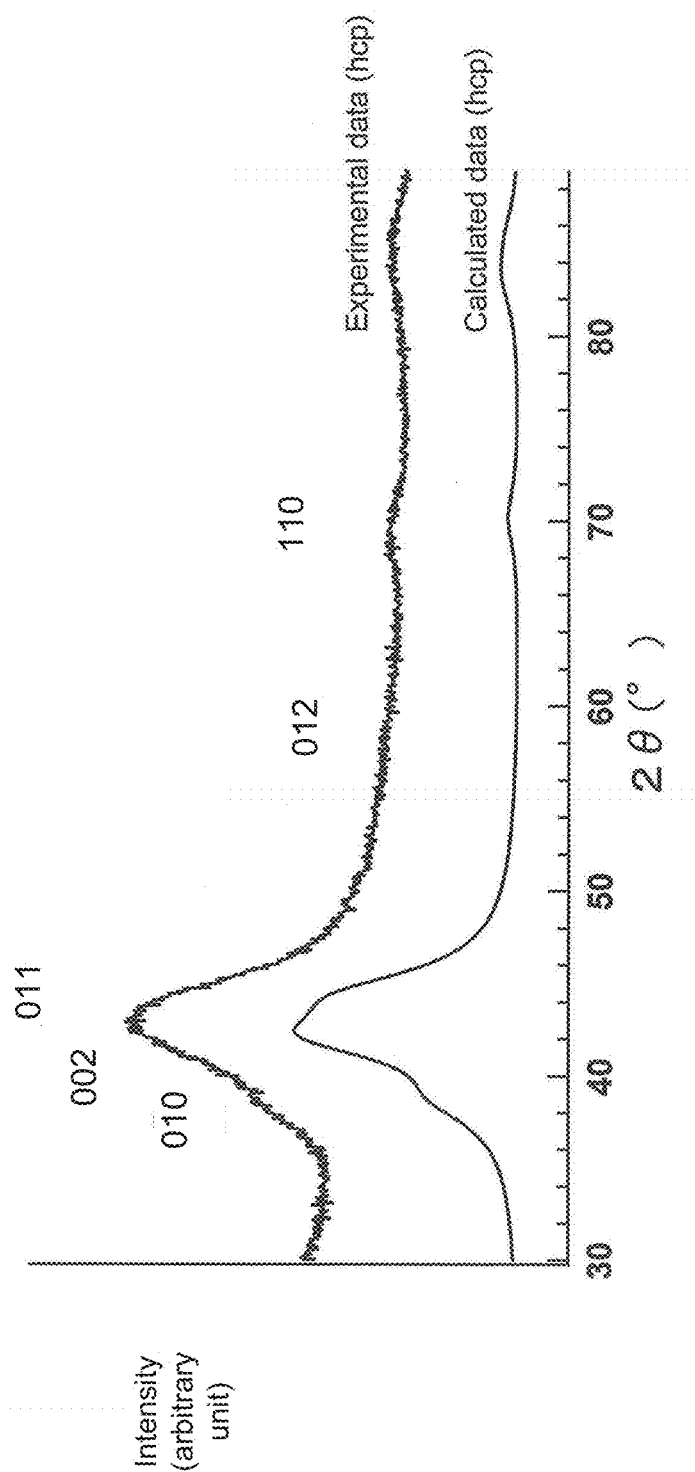
FIG. 11 shows an X-ray diffraction pattern of ruthenium nanoparticles having a hcp structure and a calculated X-ray diffraction pattern of the hcp component.

Ruthenium nanoparticles (with an average particle diameter of 2.5±0.6 nm) having a hcp structure were prepared, and the relationship between the CO oxidation activity and the temperature was measured in the same manner as described above. The ruthenium nanoparticles having a hcp structure was produced in the following manner. First, a $RuCl_3.nH_2O$ solution was prepared by mixing 200 ml of triethylene glycol, 10.0 mmol of PVP, 5 ml of water, and $RuCl_3.nH_2O$. The concentration of $RuCl_3.nH_2O$ in this solution was 9.5 mM (mmol/l). Next, the solution was heated to 180° C. and maintained at 180° C. for 1 hour. As a result, a colloidal solution of ruthenium nanoparticles with an average particle diameter of 2.5±0.6 nm was obtained. These ruthenium nanoparticles were subjected to the X-ray diffraction pattern measurement in the same manner as in Example 1. FIG. 11 shows the X-ray diffraction pattern measured. FIG. 11 also shows a calculated X-ray diffraction pattern of ruthenium nanoparticles having a crystal structure consisting of a hcp structure. As shown in FIG. 11, the X-ray diffraction pattern of the ruthenium nanoparticles can only be fitted with the hcp structure.

Figure 12:
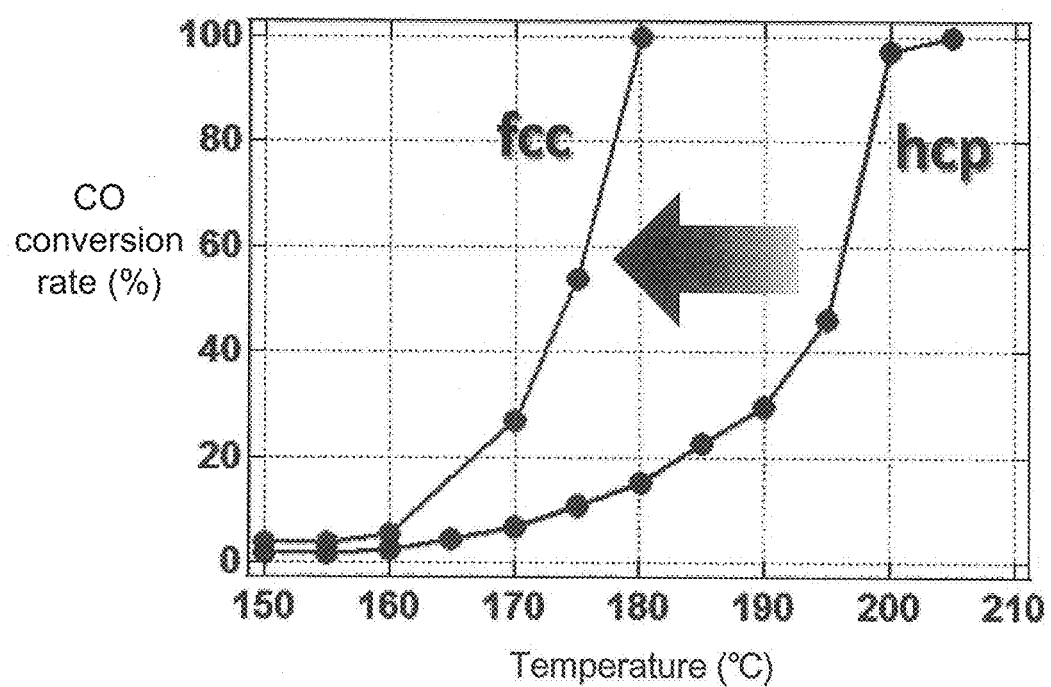
FIG. 12 is a graph showing the relationship between the CO oxidation activity and the temperature in the ruthenium nanoparticles of Example 4 and the ruthenium nanoparticles having a hcp structure.

FIG. 12 shows the evaluation results of the CO oxidation activity. In FIG. 12, the vertical axis represents the ratio of CO oxidized and converted into $CO_2$. As shown in FIG. 12, the CO oxidation activity of the ruthenium nanoparticles of Example 4 having a fcc structure was higher than that of the ruthenium nanoparticles having a hcp structure. For example, the ruthenium nanoparticles of Example 4 oxidized 50% of CO at a temperature of 180° C. or lower (about 175° C.), whereas the ruthenium nanoparticles having a hcp structure oxidized 50% of CO at a temperature of about 195° C.

The present invention is applicable to other embodiments as long as they do not depart from the spirit or essential characteristics thereof. The embodiments disclosed in this description are to be considered in all respects as illustrative and not limiting. The scope of the invention is indicated by the appended claims, and all changes which come within the meaning and range of equivalency of the claims are intended to be embraced therein.

INDUSTRIAL APPLICABILITY

The present invention can be used for ruthenium nanoparticles having a fcc structure and a production method thereof. Ruthenium nanoparticles having a fcc structure can be used in various applications. For example, they can be used as a catalyst for organic synthesis, a catalyst for fuel cell electrodes, a data storage material, etc. Ruthenium nanoparticles having a fcc structure have the potential to exhibit much higher performance than existing ruthenium nanoparticles having a hcp structure.

The invention claimed is:

1. Ruthenium nanoparticles consisting essentially of a face-centered cubic structure, wherein the ruthenium nanoparticles consist of ruthenium, and wherein the ruthenium nanoparticles have at least one peak of diffraction angle 2θ from about 46° to about 48° from (200) plane in X-ray diffraction with CuKα rays.

2. A carbon monoxide oxidation catalyst comprising the ruthenium nanoparticles according to claim 1.

3. The ruthenium nanoparticles according to claim 1, wherein an average particle diameter of the ruthenium nanoparticles is 7 nm or less.

4. The ruthenium nanoparticles according to claim 1, wherein the ruthenium nanoparticles have peaks of diffraction angle 2θ from about 41° to about 42° from (111) plane, from about 68° to about 70° from (220) plane, from about 83° to about 84° from (311) plane, and from about 88° to about 89° from (222) plane in X-ray diffraction with CuKα rays.

5. A method for producing the ruthenium nanoparticles according to claim 1 comprising a step (i) of maintaining a solution containing ruthenium (III) acetylacetonate, polyvinylpyrrolidone, and triethylene glycol at a temperature of 180° C. or higher, thereby producing the ruthenium nanoparticles of claim 1.

6. The method according to claim 5, wherein, in the step (i), the solution is maintained at a temperature ranging from 180° C. to 220° C.

7. The method according to claim 5, wherein the step (i) comprises:
   a step (a) of preparing a first organic solution containing polyvinylpyrrolidone and triethylene glycol and a second organic solution containing ruthenium (III) acetylacetonate; and
   a step (b) of spraying the second organic solution into the first organic solution heated to a temperature ranging from 200° C. to 220° C.

8. The method according to claim 5, wherein an average particle diameter of the ruthenium nanoparticles is 7 nm or less.

9. The ruthenium nanoparticles according to claim 1, wherein an average particle diameter of the ruthenium nanoparticles is 2 nm or more.

10. The ruthenium nanoparticles according to claim 1, wherein an average particle diameter of the ruthenium nanoparticles is 26 nm or more.

11. Ruthenium nanoparticles consisting essentially of a face-centered cubic structure, wherein the ruthenium nanoparticles consist of ruthenium, and wherein the ruthenium nanoparticles have an X-ray diffraction pattern that can only be fitted with a face-centered cubic lattice having a space group Fm-3m.

12. The ruthenium nanoparticles according to claim 11, wherein an average particle diameter of the ruthenium nanoparticles is 7 nm or less.

13. The ruthenium nanoparticles according to claim 11, wherein an average particle diameter of the ruthenium nanoparticles is 2 nm or more.

14. The ruthenium nanoparticles according to claim 11, wherein an average particle diameter of the ruthenium nanoparticles is 2.6 nm or more.

15. A carbon monoxide oxidation catalyst comprising the ruthenium nanoparticles according to claim 11.

16. Ruthenium nanoparticles consisting of a face-centered cubic structure, wherein the ruthenium nanoparticles consist of ruthenium.

17. The ruthenium nanoparticles according to claim 16, wherein an average particle diameter of the ruthenium nanoparticles is 7 nm or less.

18. The ruthenium nanoparticles according to claim 16, wherein an average particle diameter of the ruthenium nanoparticles is 2 nm or more.

19. The ruthenium nanoparticles according to claim 16, wherein an average particle diameter of the ruthenium nanoparticles is 2.6 nm or more.

20. A carbon monoxide oxidation catalyst comprising the ruthenium nanoparticles according to claim 16.

* * * * *